United States Patent [19]

Komorowski et al.

[11] Patent Number: 4,630,001
[45] Date of Patent: Dec. 16, 1986

[54] ELECTRICAL OSCILLATORS HAVING AUTOMATIC TUNING ARRANGEMENTS

[75] Inventors: Robert Komorowski, Fareham; Harpal Punia, Southampton, both of England

[73] Assignee: Plessey Overseas Limited, Ilford, England

[21] Appl. No.: 714,494

[22] Filed: Mar. 21, 1985

[30] Foreign Application Priority Data

Mar. 21, 1984 [GB] United Kingdom ............... 8407277

[51] Int. Cl.⁴ .............................................. H03L 7/00
[52] U.S. Cl. ..................................... 331/34; 331/1 A; 331/175
[58] Field of Search ................ 331/1 R, 1 A, 34, 154, 331/156, 158, 175; 332/9 R

[56] References Cited

U.S. PATENT DOCUMENTS 4,277,758 7/1981 Mishiro ............................. 331/1 R
4,479,098 10/1984 Watson ........................... 331/158 X Primary Examiner—Eugene R. Laroche
Assistant Examiner—Robert J. Pascal
Attorney, Agent, or Firm—Fleit, Jacobson, Cohn & Price

[57] ABSTRACT

An electrical oscillator for supplying a reactive load circuit, which comprises an automatic tuning arrangement for varying the output frequency of the oscillator in dependence upon changes in the resonant frequency of the load, in which load current frequency or phase sensing means is coupled to the load circuit and provides an electrical signal which is fed in combination with other signals dependent upon the oscillator output frequency to gating means which produces a pulse output of a particular polarity according to whether the oscillator output frequency is too high or too low and in which the output from the gating means is utilized in controlling the oscillator to increase or reduce its output frequency.

3 Claims, 2 Drawing Figures

4,630,001

ELECTRICAL OSCILLATORS HAVING AUTOMATIC TUNING ARRANGEMENTS

This invention relates to electrical oscillators and relates more specifically to automatic tuning arrangements for electrical oscillators supplying variable reactance loads.

BACKGROUND OF THE INVENTION

The automatic tuning arrangement of the invention has especial application to an oscillator circuit arrangement for supplying dc modulated pulses of a predetermined frequency (i.e. capacitor charging pulses and a variable number of timing pulses) through an inductive coupling arrangement to a chaff-dispensing rocket located ready for launch within the barrel of a rocket launcher. Such inductive coupling arrangements and rocket control circuitry are described in our co-pending British Patent Application No. 8401893. Due to various factors, such as environmental conditions, manufacturing tolerances etc, the reactance of such inductive coupling arrangements can vary and thereby produce a change in the resonant frequency of the inductive coupling arrangement.

In order to transmit the requisite electrical power to the rocket through the capacitor charging pulse, it is necessary to ensure that the frequency of the charge pulse derived from the oscillator circuit arrangement equals the resonant frequency of the inductive coupling arrangement otherwise rocket failure due to failure of the rocket to ignite or to dispense chaff as required may result.

SUMMARY OF THE INVENTION

According to the present invention there is provided in combination with an electrical oscillator circuit arrangement arranged for supplying a reactive (e.g. inductive and capacitive) load circuit, an automatic tuning arrangement for varying the output frequency of the oscillator in dependence upon changes in the resonant frequency of the load, in which load current frequency or phase sensing means is inductively coupled to the load circuit and provides an electrical signal which is fed in combination with other signals dependent upon the oscillator output frequency to gating means which produces a pulse output of a particular polarity according to whether the oscillator output frequency is too high or too low and in which the output from the gating means is utilized in controlling the oscillator to increase or reduce its output frequency as appropriate.

In carrying out the present invention the gating means may comprise a pair of AND gates to both of which are applied input signals of frequencies which are divisions of the oscillator frequency, as well as signals at the load current frequency. Some of these signals applied to one of the gates are inverted relative to those applied to the other gate so that the gates provide respective positive and negative voltage pulse outputs which cause a steady voltage output from a differential amplifier to vary to bring about a change in oscillator output frequency to correct for any change in the resonant frequency of the load circuit.

The phase sensing mean inductively coupled to the load circuit also serves to provide a voltage across current level sensing means effective when the voltage exceeds a predetermined value indicative of a short-circuit or low resistance of the load circuit to produce an output which causes gating means to provide an inhibit signal which disables the oscillator.

In applying the invention to an oscillator included in a circuit for generating trains of dc amplitude modulated pulses (i.e. ac signals amplitude modulated by rectangular wave-form pulses) for charging a power storage capacitor in a chaff-dispensing rocket through an inductive coupling arrangement of the kind described in our co-pending British Patent Application No. 8401893 and for timing the interval between rocket launch and the initiation of a chaff-dispensing operation, the voltage output from the aforesaid differential amplifier may be fed through switches which are closed during the period (e.g. 15 milli-seconds) of the charge pulse (i.e. the first pulse of the aforesaid train of pulses) to charge a capacitor as well as to control the oscillator so that the capacitor charge effectively controls the oscillator output frequency during the subsequent timing pulses when the aforesaid switches will be opened.

BRIEF DESCRIPTION OF THE DRAWINGS

By way of example an embodiment of the present invention will now be described with reference to the accompanying drawings in which.

DESCRIPTION OF AN EMBODIMENT

Figure 1:
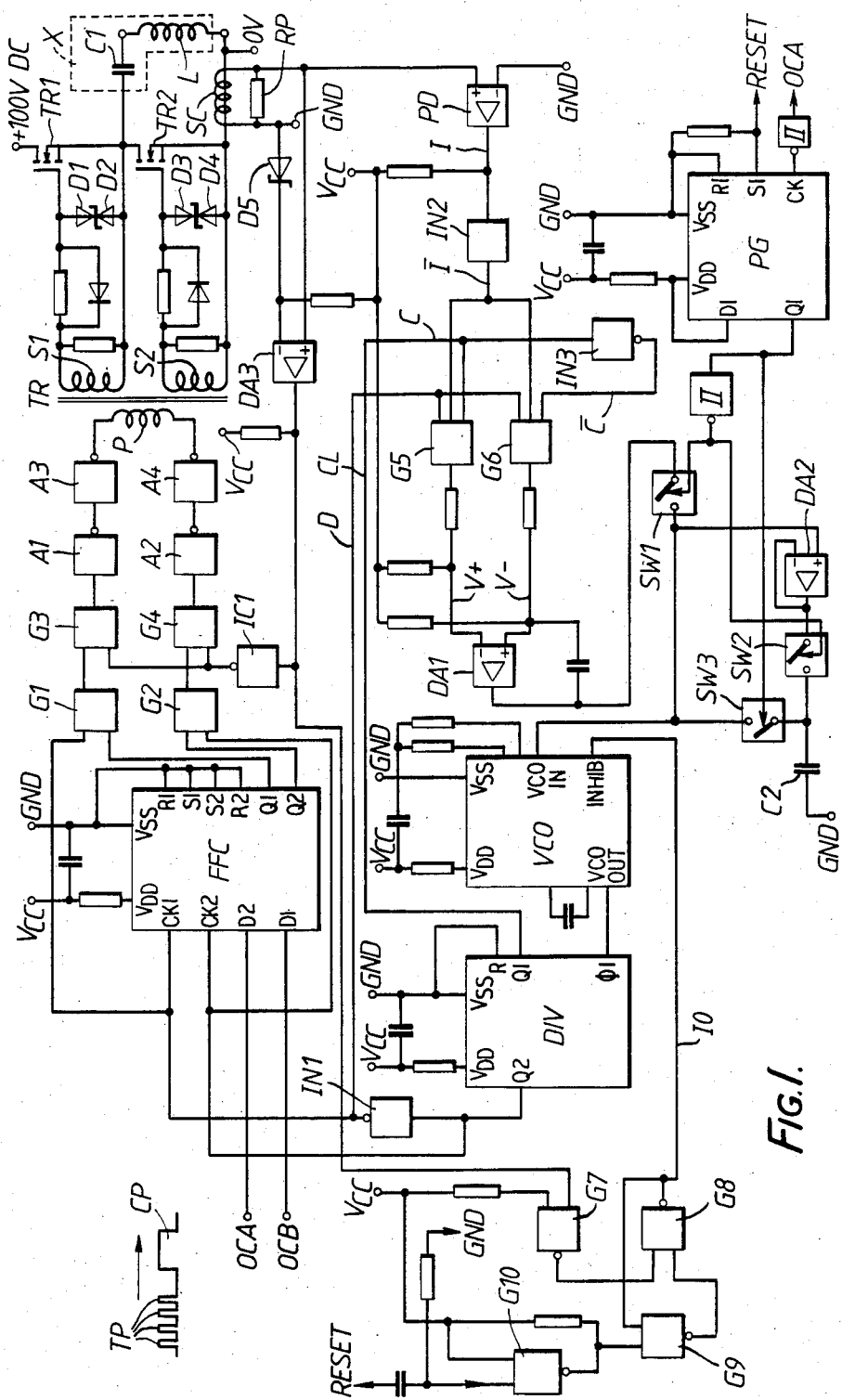
FIG. 1 shows a block schematic circuit diagram of an automatic tuning arrangement for an oscillator circuit arrangment supplying a reactive load; and, FIG. 2 shows a pulse diagram which indicates the mode of operation of the automatic tuning arrangement of FIG. 1.

Referring to FIG. 1 of the drawings, a voltage controlled oscillator VCO produces an output $VCO_{out}$ having a frequency dependent upon a dc voltage input $VCO_{in}$ applied to the oscillator. The oscillator output is fed to the input 01 of a divide-by-four frequency divider DIV. The divider output at Q2 has a frequency which is one quarter that of the oscillator frequency output. The divider output Q2 is applied directly to one terminal CK2 of a flip-flop circuit FFC on the one hand and on the other hand the divider output Q2 is applied to another terminal CK1 of the flip-flop FFC through an invertor IN1. Consequently, the signals applied to the terminals CK1 and CK2 are in anti-phase and these signals are also applied to the inputs of AND gates G1 and G2.

A train of identical dc pulses of the general form indicated is applied simultaneously to the terminals OCA and OCB, each train of pulses comprising an initial capacitor charge pulse CP (e.g. 15 milliseconds duration) which is intended to be utilized for charging a power storage capacitor (not shown) in a chaff-filled rocket followed by a variable number of timing pulses TP which determine the time period between launch of the aforesaid rocket and the initiation of a chaff-dispensing operation.

The signals applied to the terminals CK1 and CK2 of the flip-flop circuit FFC are effectively amplitude modulated by the dc pulses applied to the circuit FFC from the terminals OCA and OCB so that from the outputs Q1 and Q2 of the circuit FFC are derived trains of dc pulse modulated ac signals in anti-phase at one quarter the frequency of the output from the oscillator VCO. These outputs from Q1 and Q2 of FFC are applied to the inputs of the gates G1 and G2. The outputs from these gates G1 and G2 are applied to the inputs of respective gates G3 and G4 which are conditioned to be opened by an output from switching device IC1 as long as the inductive load is not in a short-circuited state or presents an unduly low resistance.

The outputs from the gates G3 and G4 are then amplified by amplifiers and inverting buffers A1 to A4 before being fed to the primary winding P of an isolating transformer TR. The tranformer TR has two secondary windings S1 and S2 arranged so that the outputs from the windings are in anti-phase and drive a pair of field-effect transistors TR1 and TR2 in anti-phase. Pairs of zener diodes D1, D2 and D3, D4 are connected in back-to-back relationship across the transistors TR1 and TR2 to protect the latter against voltage surges. As can be seen, the reactive load X which in the present example is to be supplied with trains of pulses comprising a charge pulse followed by a variable number of timing pulses is connected across the transistor TR2 and comprises an inductor L and a decoupling capacitor C1. For the maximum transference of power to the inductive load X the frequency of the signals modulated by the rectangular charge and timing pulses should correspond to the resonant frequency of the reactive load. Thus the frequency of the output from the frequency divider DIV should equal the resonant frequency of the reactive load. However, in cases where the reactive load X and consequently the resonant frequency can vary, the maximum power transference to the load X will not take place unless the frequency of the modulated pulses is varied accordingly. For example, in the case of the present embodiment the reactive load is intended to be constituted by an inductive coupling arrangement between a rocket launcher and a rocket located in the launcher barrel, which arrangement provides for the transference of power to the rocket for performing various functions including the ignition of the rocket motor and initiation of a chaff-dispensing operation at a predetermined time interval after launch of the rocket, which interval is determined by the number of timing pulses also received over the inductive coupling arrangement. Variations in the spacing between the base of the rocket and the launcher due to manufacturing tolerances etc, and environmental conditions can vary the reactance of the inductive coupling arrangement and can give rise to serious problems including rocket failure due to insufficient power being transferred across the coupling arrangement.

With a view to overcoming these problems a load current sensor coil SC is inductively coupled to the reactive load circuit in order to monitor the load current as regards frequency (or phase) so that any necessary correction can be made to the oscillator output frequency by a negative feedback arrangement to ensure that the divider frequency equals the resonant frequency of the load X. The magnitude of the load current is also monitored whereby under short-circuit or low resistance conditions, the oscillator can be disabled.

For the frequency monitoring procedure a phase detector PD is connected to the sensor coil SC and the output (I) from this phase detector PD is fed into an invertor IN2, the output ($\bar{I}$) from which is fed to AND gates G5 and G6. These gates G5 an G6 also have applied to inputs thereof over a clocking lead CL respective clock pulses (C and $\bar{C}$) at one half the oscillator output frequency and derived from output Q1 of the frequency divider DIV, the clock pulses $\bar{C}$ being provided at the output of an invertor IN3.

Figure 2:
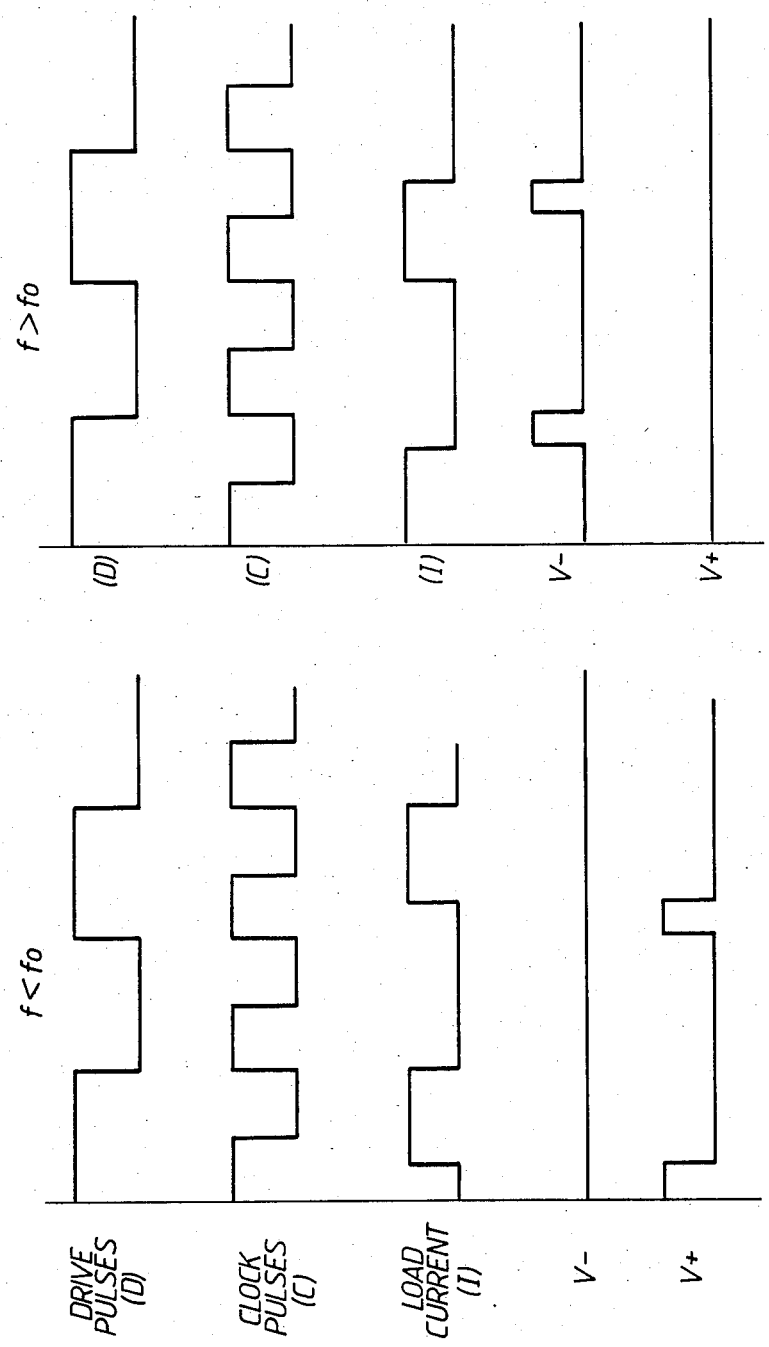

Additionally, drive pulses (D) at one quarter of the oscillator frequency are derived from the inverter IN1 and are applied to further inputs of the AND gates G5 and G6. Referring to FIG. 2, voltage output pulses V+ or V− will be derived from the gate G5 or G6 according to whether the frequency of the oscillator VCO is too low or too high.

These output pulses V+ and V− are fed into a differential amplifier DA1 which provides a steady dc output when the divided oscillator frequency (f) equals the resonant frequency (fO) of the reactive load circuit X. This steady voltage output from the differential amplifier DA1 is applied to a solid state switch SW1 which is arranged to be closed for the duration of a charge pulse by a signal received from terminal Q1 of a circuit PG arranged to be clocked by the charge pulse CP applied to the terminal OCA. The switch SW1 extends the steady state voltage to the input $VCO_{in}$ of the oscillator VCO which controls the oscillator output frequency. At the same time, the steady state voltage is also applied from the switch SW1 to a capacitor C2 to charge the capacitor through a further switch SW2, also closed during a charge pulse, and a differential amplifier DA2. The switch SW2 is also operated to its closed state by a signal derived from terminal Q1 of the circuit PG.

If when the leading edge of the charge pulse CP is applied to the terminals OCA and OCB and load current connector to flow in the load circuit the divided frequency of the oscillator VCO is found to be different from the resonant frequency of the reactive load, then V+ pulses or V− pulses will be produced at the outputs of the gates G5 or G6 according to the sense of the frequency difference. These V+ or V− pulses will then produce a change in the value of the dc output of the differential amplifier DA1 and this change in output will be fed to the oscillator VCO via the closed switch SW1 and the oscillator output frequency will accordingly be increased or decreased, as the case may be, until the divided oscillator frequency corresponds to the resonant frequency of the reactive load.

Thus, during the charge pulse the oscillator frequency will be maintained at the appropriate frequency. At the end of the charge pulse a change in the signal from terminal Q1 of the circuit PG will cause the switches SW1 and SW2 to open, but a switch SW3 will close so as to extend the dc voltage on the capacitor C2 to the oscillator input $VCO_{in}$ to maintain operation of the oscillator for the duration of the following timing pulses.

In the event of a short-circuit or low impedance condition in the load circuit X, the voltage difference applied to a differential amplifier DA3 connected across the sensor coil SC in parallel with its resistor RP and a series voltage limiting zener diode D5 will cause a signal to be applied on the one hand to the circuit IC1, to disable the AND gates G3 and G4 and on the other the hand to an AND gate G7. The output from the gate G7 is applied to an AND gate G8 which accordingly produces an inhibit output IO in order to disable the oscillator VCO. The output from the gate G8 is also applied to a latching AND gate G9, the output from which causes the gate G8 to be latched until such time as a reset pulse derived from the circuit PG is applied to the reset terminal to operate a reset gate G10, the output from which will close the latching gate G8 and thereby cause the inhibit signal IO to be removed from VCO, provided of course the short-circuit or low impedance condition has been removed from the load circuit X.

We claim:

1. An electrical oscillator for supplying a reactive load circuit, comprising an automatic tuning arrangement for varying the output frequency of the oscillator in dependence upon changes in the resonant frequency of the load, in which load current frequency or phase sensing means is coupled to the load circuit and provides an electrical signal which is fed, in combination with other signals dependent upon the oscillator output frequency, to gating means which includes a pair of AND gates to both of which are applied input signals of frequencies which are divisions of the oscillator frequency as said other signals, as well as said electrical signal at the load current frequency, some of these input signals applied to one of the gates being inverted relative to those input signals applied to the other gate whereby the gates provide respective positive and negative voltage pulse outputs which cause a steady voltage output from a differential amplifier to vary to bring about a change in oscillator output frequency to correct for any change in the resonant frequency of the load circuit.

2. An electrical oscillator as claimed in claim 1, in which the phase sensing means is arranged to provide a voltage across current sensing means effective when the voltage exceeds a predetermined value indicative of a short-circuit or low resistance of the load circuit to produce an output which causes gating means to provide an inhibit signal which disables the oscillator.

3. An electrical oscillator as claimed in claim 1 forming part of a circuit for generating trains of d.c. amplitude-modulated pulses for charging a power storage capacitor and for timing a time interval, in which the voltage output from the differential amplifier is fed through switches which are closed during the period of a charge pulse to charge the capacitor as well as to control the oscillator so that the capacitor charge effectively controls the oscillator output frequency during subsequent timing pulses timing said time interval when the aforesaid switches are opened.

* * * * *